(12) United States Patent
Le Loc'h et al.

(10) Patent No.: US 10,820,418 B2
(45) Date of Patent: Oct. 27, 2020

(54) ELECTRONIC MODULE, METHOD FOR MANUFACTURING SAME AND ELECTRONIC DEVICE COMPRISING A MODULE OF SAID TYPE

(71) Applicant: GEMALTO SA, Meudon (FR)

(72) Inventors: Alain Le Loc'h, Gemenos (FR); Jean-Marie Bertolotti, Gemenos (FR); Jean-Christophe Fidalgo, Gemenos (FR)

(73) Assignee: THALES DIS FRANCE SA, Meudon (FR)

( * ) Notice: Subject to any disclaimer, the term of this patent is extended or adjusted under 35 U.S.C. 154(b) by 315 days.

(21) Appl. No.: 15/109,687

(22) PCT Filed: Dec. 16, 2014

(86) PCT No.: PCT/EP2014/078085
§ 371 (c)(1),
(2) Date: Jul. 5, 2016

(87) PCT Pub. No.: WO2015/101489
PCT Pub. Date: Jul. 9, 2015

(65) Prior Publication Data
US 2016/0330841 A1    Nov. 10, 2016

(30) Foreign Application Priority Data

Jan. 6, 2014 (EP) .................................. 14305010

(51) Int. Cl.
*G06K 19/077* (2006.01)
*H05K 1/09* (2006.01)
(Continued)

(52) U.S. Cl.
CPC ......... *H05K 1/18* (2013.01); *G06K 19/07747* (2013.01); *G06K 19/07775* (2013.01);
(Continued)

(58) Field of Classification Search
CPC ........ H05K 1/18; H05K 1/111; H05K 3/4007; H05K 3/125; H05K 3/1275; H05K 3/32;
(Continued)

(56) References Cited

U.S. PATENT DOCUMENTS 5,097,117 A * 3/1992 Champagne ..... G06K 19/07745
                                                        235/488
6,159,832 A * 12/2000 Mayer ................... C23C 14/048
                                                        257/E21.169
(Continued)

FOREIGN PATENT DOCUMENTS

FR       2 880 160 A1    6/2006
WO    WO 97/26621 A1    7/1997
(Continued)

OTHER PUBLICATIONS

International Search Report (PCT/ISA/210) dated Feb. 25, 2015, by the European Patent Office as the International Searching Authority for International Application No. PCT/EP2014/078085.
(Continued)

*Primary Examiner* — Nathan Milakovich
(74) *Attorney, Agent, or Firm* — Buchanan Ingersoll & Rooney PC

(57) ABSTRACT

The invention relates to an electronic module comprising a dielectric support film having a first side, conductor paths that are printed on said first side, and a semiconductor component which connects the conductor paths by means of electrical connections. The electronic module of the invention is characterized in that each electrical connection includes a lead wire that connects a contact of the semiconductor component to each path directly or via an island or an interconnection pad.

5 Claims, 3 Drawing Sheets

(51) Int. Cl.
*H05K 1/11* (2006.01)
*H05K 1/18* (2006.01)
*H05K 3/12* (2006.01)
*H05K 3/32* (2006.01)
*H05K 3/40* (2006.01)
*H01Q 1/38* (2006.01)

(52) U.S. Cl.
CPC ............... *H01Q 1/38* (2013.01); *H05K 1/097* (2013.01); *H05K 1/111* (2013.01); *H05K 3/125* (2013.01); *H05K 3/1275* (2013.01); *H05K 3/32* (2013.01); *H05K 3/4007* (2013.01); *H01L 2224/45144* (2013.01); *H01L 2224/48228* (2013.01); *H01L 2224/49109* (2013.01); *H01L 2224/49171* (2013.01)

(58) Field of Classification Search
CPC .... H05K 1/097; H01Q 1/38; G06K 19/07747; G06K 19/07775
See application file for complete search history.

(56) References Cited

U.S. PATENT DOCUMENTS

| | | | | |
|---|---|---|---|---|
| 6,301,119 | B1* | 10/2001 | Thevenot | G06K 19/07749 174/260 |
| 6,468,835 | B1* | 10/2002 | Blanc | G06K 19/07743 438/127 |
| 6,568,600 | B1 | 5/2003 | Carpier et al. | |
| 10,381,295 | B2* | 8/2019 | Vincent | H01L 24/17 |
| 10,658,283 | B2* | 5/2020 | Degeilh | H01L 23/49855 |
| 2002/0089049 | A1 | 7/2002 | Leduc et al. | |
| 2004/0160465 | A1* | 8/2004 | Baker-Smith | H05K 3/125 347/1 |
| 2005/0212690 | A1* | 9/2005 | Nishikawa | G06K 7/006 340/932.2 |
| 2006/0139901 | A1 | 6/2006 | Meireles et al. | |
| 2008/0205012 | A1* | 8/2008 | Heinemann | G06K 19/07743 361/767 |
| 2013/0033840 | A1* | 2/2013 | Welling | G06K 19/07345 361/783 |
| 2014/0104133 | A1* | 4/2014 | Finn | G06K 19/07769 343/866 |
| 2015/0339565 | A1* | 11/2015 | Pueschner | G06K 19/07747 235/488 |
| 2018/0323139 | A1* | 11/2018 | Degeilh | H01L 23/49855 |

FOREIGN PATENT DOCUMENTS

| | | |
|---|---|---|
| WO | WO 98/33143 A1 | 7/1998 |
| WO | WO 00/43951 A1 | 7/2000 |
| WO | WO 2004/079647 A1 | 9/2004 |

OTHER PUBLICATIONS

Written Opinion (PCT/ISA/237) dated Feb. 25, 2015, by the European Patent Office as the International Searching Authority for International Application No. PCT/EP2014/078085.

* cited by examiner

ELECTRONIC MODULE, METHOD FOR MANUFACTURING SAME AND ELECTRONIC DEVICE COMPRISING A MODULE OF SAID TYPE

FIELD OF THE INVENTION

The invention relates to the technical field of electronic modules comprising at least one electronic component, for example of the integrated circuit chip type and preferably intended to connect this electronic component electrically to an electric circuit. The invention also relates to a method for manufacturing a module of said type. It finally relates to electronic devices comprising an electronic module of said type. Such devices may for instance adopt the form of a card, label, ticket or booklet and find applications particularly, but not exclusively, in access control, transports, identification or payment for example. In a broad sense, a module may also be a printed circuit.

Prior Art

Various different types of electronic device exist today. There are in particular devices operating with contact, devices operating without contact, so-called "hybrid" devices operating with and/or without contact and so-called "interconnected" devices comprising one or several electrical or electronic circuits, electrically connected to the electronic module and more specifically to the semiconductor component that it contains. Electric circuits of this kind, particularly interconnected electric circuits, may comprise for example a radio frequency antenna or an ultra-high frequency antenna and/or one or several electrical or electronic components connected electrically to the semiconductor component.

In the prior art below, the preferred application of a hybrid electronic device or an interconnected device will in particular be considered, comprising an electronic module, arranged in a cavity created in the body of the device and designed to be connected electrically to (or connecting) at least one other electric circuit. The latter electric circuit may or may not include one or several other electrical/electronic components.

In general, so-called "double-sided" electronic modules are used for this type of device, which comprise a layer of copper assembled on each side of a dielectric support film. A double-sided module of said type is therefore formed by assembling a dielectric film and two metallised layers. The first metallised layer is etched in order to mark out the contours of the contact pads of a connection terminal designed to be flush with the surface of the electronic device in which the module is inserted. The second metallised layer is etched in order to mark out the contours of the conductor paths. It is furthermore possible to subject both these metallised layers to a surface treatment involving addition of a supplementary nickel- and gold-based metallisation layer, forming a passivation layer, thus protecting the metallised layers against oxidation. A semiconductor component such as an integrated circuit chip for example is attached to the side of the dielectric film bearing the second metallised layer etched in the form of conductor paths.

Conventionally, the chip is attached to the dielectric film, with the former's active side facing the outside of the film, wherein its contact studs are connected to the contact pads of the connection terminal using a well-known method called "wire bonding", involving the use of metallic wires made of gold, aluminium, copper or silver and passing the latter through spaces reserved in the thickness of the dielectric film, opposite the contact pads to be connected. The contact studs of the chip are furthermore connected to the conductor paths of the second metallised layer. The chip and connection wires are subsequently encapsulated in a protective resin.

A double-sided module of said type requiring use of two metallised layers is however costly. The market for hybrid electronic devices or interconnected devices is booming and electronic modules of the double-sided type need to be mass produced. Such a module, of the double-faced type, must therefore present a high level of reliability in addition to the lowest possible cost price.

An alternative solution was considered in the past in order to reduce the prime costs of a double-sided module. This solution, described in patent application WO2000043951, involves creating a single metallised layer and using contact pads to establish electrical connections between the inputs/outputs of the semiconductor component and the interconnection terminals of an antenna. This solution is not however adaptable to the various different configurations of existing integrated circuit chips, so that provision must be made for as many designs of electronic modules as the variety of different chips. Consequently, this solution is still too expensive for large-scale industrial production.

Technical Problem

The aim of the invention is therefore to eliminate at least one of the disadvantages of the prior art.

The invention aims in particular to offer a simple and economical solution for production of an electronic module, particularly of the double-sided type, capable of allowing an electrical connection between the electronic component that it contains and an other electrical or electronic circuit, wherein the module is furthermore adaptable to any configuration of the electronic component.

SUMMARY OF THE INVENTION

The principle of the invention is based on creating, on the side of the dielectric film, conductor paths using a printing process, wherein connection of a component to the conductor paths is preferably performed directly by a lead wire or via an island or a conductive interconnection pad. The paths may therefore be printed and their shape adapted to a semiconductor component at the last minute. The high cost of etching can be avoided. The process only uses a small amount of material to form metallisations. Unlike the practice regarding metallisation printing, an economical method of connection by a lead wire can be used.

The film may comprise, on the side opposite that bearing the printed paths, other electrically conductive paths or pads produced conventionally by etching (like printed circuits) or chip card modules in order to form a film with conductor paths or surfaces on both sides (double-sided). Other electrically conductive paths or pads or surfaces may also be created using a printing process on the support film (or an insulating substrate).

To this end, the subject of the invention is an electronic module comprising a dielectric support film, having a first side, conductor paths that are printed on said first side and a semiconductor component which connects the conductor paths by means of electrical connections, characterised in that each electrical connection includes a lead wire that connects a contact of the semiconductor component to each path directly or via an island or an interconnection pad.

Hence, the paths are only printed at the positions required to allow establishment of an electrical connection and a much smaller quantity of metal is used to that of a metallised layer which is subsequently etched. Printing the conductor paths with a metallic ink or electrically conductive material therefore allows a considerable reduction in the prime costs of the module. Moreover, printing the conductor paths makes it possible to adapt and customise the module to any electronic component configuration.

According to other optional characteristics of the electronic module:

each printed conductor path comprises a second end forming an interconnection pad designed to be electrically connected to an interconnection terminal of said electric circuit, the dielectric support film furthermore bears on a second side, several electrical contact pads, wherein said semiconductor component is electrically connected to said electrical contact pads, a first end of the lead wire is fixed to the contact stud of said semiconductor component whilst the other end of the lead wire passes through a reservation formed in the thickness of the dielectric film with respect to a contact island marked out in a contact pad and is fixed to said contact island; the first end of the printed conductor path is created in said reservation on the surface of said contact island and emerges on the surface of the first side of said dielectric support film.

the material constituting the printed conductor paths is compatible with the material constituting the lead wire and vice versa, the material constituting the printed conductor paths is a conductive ink containing metallic nanoparticles based on at least one of the following metals: gold, silver, copper, aluminium, palladium, or mixtures based on tin-coated copper nanoparticles, silver-coated copper nanoparticles, palladium-coated copper nanoparticles or copper nanoparticles coated with a layer of Ni/Au, the electric circuit comprises a radio frequency antenna, an ultra-high frequency antenna and/or any electric circuit bearing at least one other semiconductor component, the electric circuit is an antenna created on the surface of the first side of said dielectric support film, advantageously, this antenna is also produced by conductive ink printing, the electric circuit is outside the module and is embedded in the body of an electronic device in which said module is intended to be inserted, the electric circuit may comprise a conductive path and/or area produced by conductive ink (or material) printing on the support film.

The invention also aims to propose a manufacturing process of an electronic module comprising a support film bearing conductor paths and a semiconductor component connected to the conductor paths, wherein said process comprises a stage of printing conductor paths on a first side of the dielectric support film by means of a process involving printing, transfer and connection of a contact of the semiconductor component to the conductor paths by means of connections, characterised in that each electrical connection is established by a lead wire directly or via an island or an interconnection pad.

Preferably, the process includes a stage of coating or protection, at least partial, of the semiconductor component and its connections by a protective resin. Protection may also be provided otherwise by a cavity or a protective cover.

According to other optional characteristics of the manufacturing process:

the process furthermore comprises a prior stage involving assembling a metallised layer on a second side of the dielectric support film, creating several electrical contact pads in said metallised layer and electrically connecting said semiconductor component to said electrical contact pads, the second end of each printed conductor path is created on a surface so as to form an interconnection pad designed to be electrically connected to an interconnection terminal of said electric circuit each end of the lead wire is fixed on the one hand to a contact stud of the semiconductor component and on the other hand to an electrical contact island, the contours of which are previously marked out in a contact pad, passing through a reservation formed in the thickness of the dielectric film with respect to said contact island, so that it electrically connects said contact stud of the semiconductor component to said contact island and in that the first end of the conductor path to be connected is printed on the surface of said contact island in said reservation and emerges on the side of the dielectric film bearing said semiconductor component, the conductor paths are printed using one of the following methods: inkjet, spray, LIFT, silkscreen printing, flexography or indeed heliography.

The invention finally relates to an electronic device comprising an electric circuit embedded in its body and an electronic module inserted in a cavity arranged in its body, wherein said electric circuit comprises interconnection terminals to be connected to said module, characterised in that the electronic module is consistent with the module described above, wherein its interconnection pads, formed by the second end of the conductor paths printed on the dielectric film, are arranged opposite the interconnection terminals of said electric circuit and the electrical connection between said interconnection pads of said module and said interconnection terminals of said electric circuit comprises an electrically conductive material.

This device advantageously constitutes a hybrid device operating with and/or without contact, or a multicomponent interconnected device. By way of an example, a chip card with and/or without contact, a ticket with and/or without contact, a label with and/or without contact, or a passport-type booklet may be involved.

BRIEF DESCRIPTION OF THE FIGURES

Other particularities and advantages of the invention will become apparent on reading the description below made by way of an illustrative and non-limitative example, with reference to the appended drawings in which.

DESCRIPTION

Electronic devices may adopt various different forms such as a card with and/or without contact, a label, a ticket, or even a booklet when an identity passport is for example involved. These devices must comply with standards such as standard ISO 7816 when a contact device is involved or standard ISO14443 when the device contains a communications interface adopting the form of an antenna for example.

The invention applies to any electronic device comprising an electric circuit electrically connected to the semiconductor component of the electronic module. In the examples described below, the electric circuit comprises a radio frequency antenna, or an ultra-high frequency antenna. The device according to the invention is not however limited to this example and the electric circuit may advantageously comprise such an antenna and/or any other electronic component.

The principle of the invention according to the preferred embodiment involves avoiding use of two metallic layers, which are too costly, in order to produce a module of the double-sided type designed to equip these devices.

Figure 1:
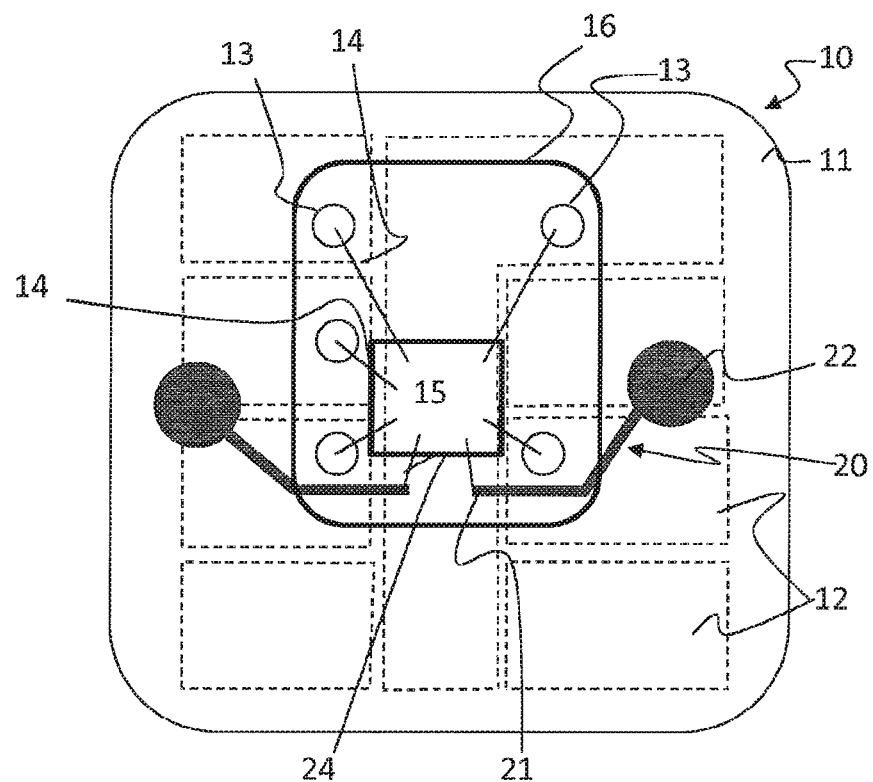
FIG. 1 is a diagram of an electronic module according to the invention seen from its side bearing a semiconductor component.

The invention according to the preferred embodiment therefore entails using a standard, single-sided module 10, i.e. comprising a dielectric support film assembled with a metallic layer on only one of its sides. FIG. 1 diagrammatically illustrates an example of an electronic module according to the invention, seen from below, i.e. from the side of the dielectric film 11 opposite the electrical contact pads 12, represented as dotted lines in FIG. 1. The contact pads 12 are obtained by etching the metallic layer assembled with the dielectric film and form a connection terminal designed to be flush with the surface of the electronic device. Preferably, these contact pads undergo a surface treatment involving addition of a supplementary nickel- and gold-based metallic layer in order to form a passivation layer. The electronic component 15, such as an integrated circuit chip for example, is subsequently transferred, by bonding for instance, to the side of the dielectric film 11 opposite the contact pads 12. Reservations 13, or orifices, are advantageously created in the thickness of the dielectric film 11, perpendicular to the contact pads 12 to be connected to the electronic component 15. The contact studs of the electronic component 15 are subsequently electrically connected to the contact pads 12, using a conventional method known as "wire bonding", involving the use of gold, aluminium, silver or copper wires and soldering each of their ends respectively to a contact stud of the semiconductor component 15 and to a contact pad 12 of the connection terminal by passing the wire in a reservation 13 previously created in the thickness of the dielectric film 11.

In order to be able to create a module of the double-sided type based on this single-sided module, the invention subsequently entails printing, on the side of the dielectric film bearing the semiconductor component 15, conductor paths 20 allowing electrical connection of the semiconductor component 15 to another electric circuit which may be outside the module or possibly on the surface of the dielectric film 11 of the module.

In this case, the conductor paths have two ends. A first end 21 is designed to be connected electrically to a contact stud of the semiconductor component 15, whilst the other end 22 is printed in the form of an interconnection pad, having an area greater than that of the first end. By way of an example, the area of this interconnection pad 22 may be on the order of 1 mm2. This interconnection pad is designed to be electrically connected to the interconnection terminals of an electric circuit, such as for example the end terminals of a radio frequency antenna.

According to a first embodiment and as illustrated in FIG. 1, the first end of each conductor path is electrically connected in this case to a contact stud of the semiconductor component 15 using the conventional "wire bonding" method. For this purpose, each end of a lead wire 24, such as a gold, aluminium, silver or copper wire for example, is fixed for instance by soldering, respectively to the contact stud of the semiconductor component 15 and to the first end 21 of a printed conductor path 20. The semiconductor component and the latter's electrical connections are subsequently preferably encapsulated in a protective resin 16, with the exception of the interconnection pads 22 defined by the second end of the printed conductor paths and designed to be electrically connected to the interconnection terminals of an electric circuit.

In this case, the printing method used may be an inkjet, spray or LIFT technique (acronym for "Laser Induced Forward Transfer"), which is a laser-assisted deposition method, by silkscreen printing, flexography or heliography. Preferably, the conductor paths 20 are printed by inkjet, spray or LIFT.

These printing methods use a conductive ink selected from at least one of the following inks: an ink based on metallic nanoparticles, including for example gold, silver, copper, palladium, aluminium or furthermore mixtures based on tin-coated copper nanoparticles, silver-coated copper nanoparticles, palladium-coated copper nanoparticles or copper nanoparticles coated with a layer of Ni/Au.

These inks moreover display high compatibility with the connection methods used and the conventional card manufacturing methods, particularly with the connection methods of the "wire bonding" type or based on silver adhesive. Such compatibility allows good quality electrical connections to be obtained.

Using conductive ink printing in order to create the conductor paths allows adaptation of the module depending on the configuration of the contact studs of the semiconductor component 15 to be transferred to the module. Consequently, production of such a module of the double-sided type is highly adaptable and can be customised depending on the semiconductor 15 to be transferred.

Producing conductor paths 20 by conductive ink printing uses only small quantities of metal, particularly during inkjet printing where the thickness of ink applied is small and on the order of a few nm to a few μm. Furthermore, the metallic ink is deposited exactly at the positions required in order to define the conductor paths, so that the side of the dielectric that bears the chip comprises very little metal and features free space which can be used for transferring other components and/or electric circuits. The prime cost of a module of said type is therefore substantially reduced in relation to that of a conventional double-sided module.

When the ink layer is thin, particularly when the paths are printed using the inkjet method that involves a thin deposit using little material, the electrical connection with the lead wire may prove tricky to perform. Furthermore, this connection is liable to fail to adequately withstand the stresses of torsion or flexion, during handling of the electronic device in which the module is inserted. In this case, a second embodiment may be considered in order to reinforce the robustness of the electrical link between a lead wire and a printed conductor path. According to this second embodiment, illustrated in FIG. 3, the electrical connection between a printed conductor path 20 and a contact stud of the semiconductor component 15 is established by using a lead wire 19 and a portion of contact pad as a relay point.

According to this second embodiment, an island 17 is defined, for each conductor path to be connected to the semiconductor component 15, in an electrical contact pad 12 of the connection terminal. For this purpose, a portion of contact pad for instance is etched, for example a portion of the pad reserved for the earth in accordance with standard ISO 7816. Etching a portion of contact pad allows isolation of a contact island 17 and its use as a relay point in an electrical connection. The contact island 17 thus defined is subsequently electrically connected using the conventional wire bonding method to a stud of the semiconductor component 15, by passing a lead wire 19 into a reservation 18 created in the thickness of the dielectric film 11 perpendicular to the contact island 17. The end 21 of the printed conductor path 20 to be connected to this contact stud is subsequently printed directly on the surface of the contact island 17, in the reservation 18 created perpendicular to the island 17 and emerges on the surface of the dielectric 11.

In order to be able to print in the reservation 18, the walls of which are generally vertical, without however affecting the electrical continuity of the conductor paths 20 that emerge on the surface of the dielectric film 11, the method of printing by spray or LIFT is preferably used.

Figure 2:
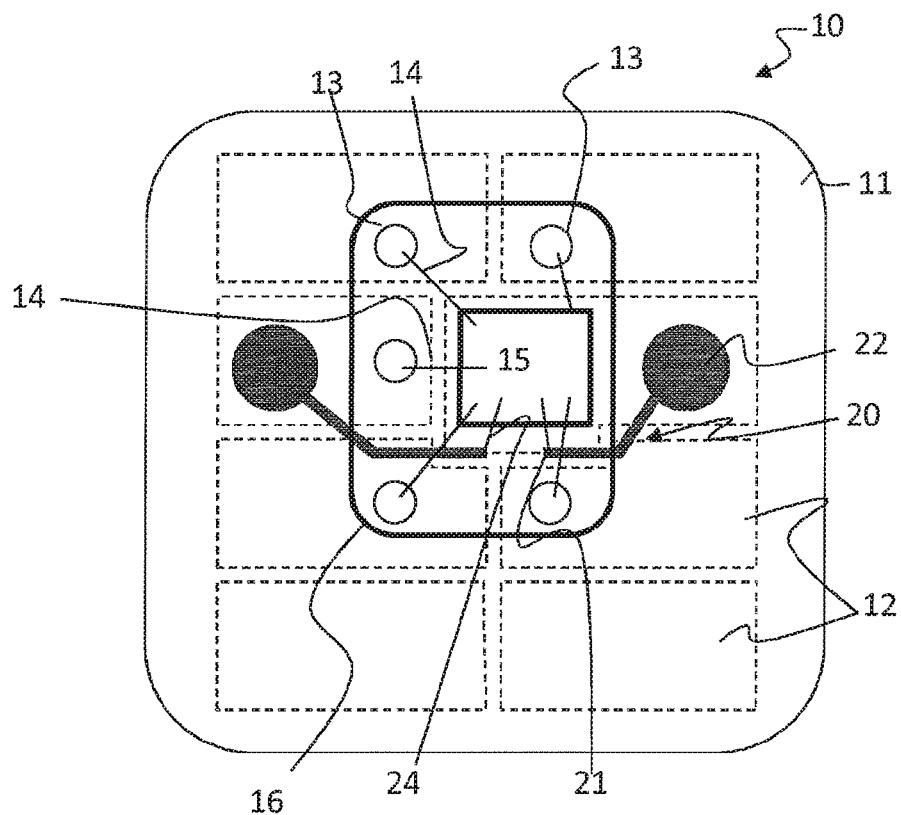
FIG. 2 is a diagram of an electronic module seen from its side bearing a semiconductor component, according to an embodiment variant.

A third embodiment, illustrated in FIG. 2, involves transferring the semiconductor component 15 to the dielectric film 11 eccentrically in relation to the connection terminal formed by the contact pads 12 of the opposite side.

A chip card connection terminal compliant with standard ISO 7816 comprises 6 to 8 useful electrical contact pads 12. The contact pads are denoted C1 to C8 in standard ISO 7816-2. Furthermore, the standard stipulates assignment of contact pads to specific signals: pad C1 receives the supply voltage Vcc, C2 carries the signal RST for initialisation, C3 corresponds to a clock signal CLK, C4 corresponds to the data signal D+ for USB communication, but may be used other than for USB, C5 receives a ground voltage GND, C6 is designed to receive a voltage VPP for programming the memory card, but is currently no longer used, C7 corresponds to an I/O signal for data exchange and C8 corresponds to the data signal D− for USB communication, but may be used other than for USB.

The semiconductor component 15 may be transferred eccentrically in relation to the centre of the connection terminal. It may for example be transferred opposite the standardised contact pad C6 in accordance with standard ISO7816. Offsetting the position of the semiconductor component 15 in relation to the connection terminal allows saving of space on the surface of the dielectric film 11 by reducing the coating area 16 and by also recentring the printed interconnection pads 22. In this manner, space is freed on the side of the dielectric film 11 intended to be fixed in the cavity of a body of an electronic device. This freed space allows for example an increase in the bonding surface of the module in the cavity of an electronic device, thereby enhancing the resistance of the module to being torn out.

In another embodiment, the saving in space brought about the printing the conductor paths 20 on the side of the dielectric film 11, particularly when the chip is transferred eccentrically, allows one to envisage creation of an electric circuit directly on the electronic module.

Figure 4:
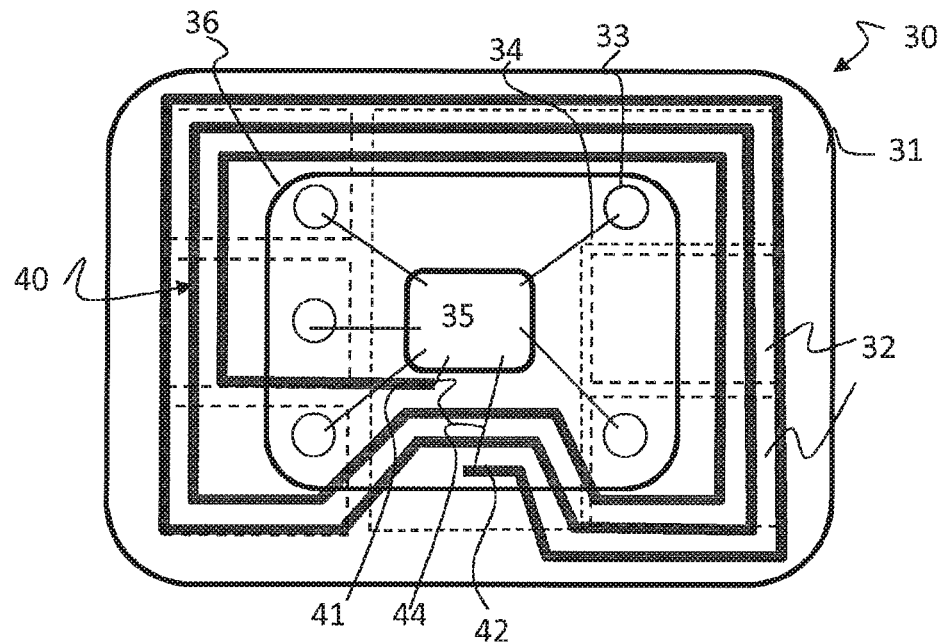
FIG. 4 is a diagram of an electronic module seen from its side bearing a semiconductor component and a radio frequency antenna.

In another example, illustrated in FIG. 4, the conductor paths of the module 30 may furthermore be confused with the electric circuit, particularly when the latter adopts the form of a radio frequency antenna 40 for example. In this case, the antenna 40 may be produced by conductive ink printing on the surface of the dielectric film 31, around the component 35 and its two ends 41, 42 are electrically connected to a contact stud of the semiconductor component 35 via a lead wire 44. The component 35 and the connection wires may subsequently be encapsulated at least partially in a protective resin 36. In the case of an antenna, turns designed to be overlapped can be electrically insulated by an insulating material in order to avoid a short circuit. The module may or may not comprise contact pads 32 (as a dotted line) on the other side opposite that 31 bearing the electric circuit printed using a printing process.

Figure 5:
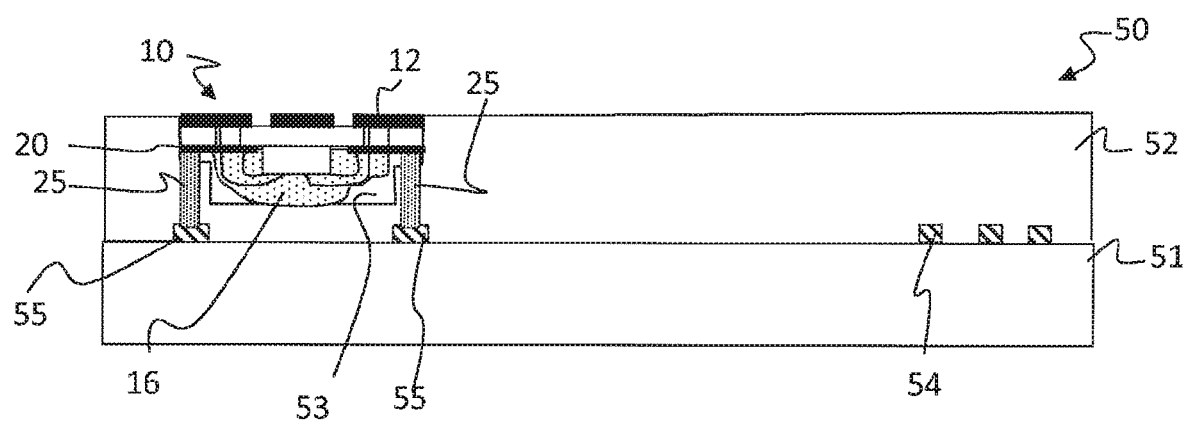
FIG. 5 is a cross-sectional diagram of an example of an electronic device including a module according to the invention, connected to an electric circuit embedded in the body of said device.

FIG. 5 diagrammatically represents a cross-sectional view of an electronic device 50 adopting the form of a hybrid chip card. This card contains a radio frequency antenna 54, 55. The card body comprises several layers, referenced 51 and 52 in FIG. 5. A cavity 53 arranged in the card body is designed to receive the electronic module 10 according to the invention. The end terminals 55 of the antenna are located on either side of the cavity 53. Wells 25 are sunk in the card body, perpendicular to the end terminals 55 in order to cover the latter. An electrically conductive material, of the conductive polymer type for example, is subsequently used to fill the wells 25 in order to connect electrically the end terminals 55 of the antenna buried in the card body 51, 52, to the interconnection pads 22 of the conductor paths 20 printed on the concealed side of the module 10.

The double-sided module that has just been described has the advantage of being very low-cost, as it uses very little metal on its second side opposite the contact pads. It is furthermore flexible, since the conductor paths are printed depending on the configuration of the semiconductor component to be transferred. Consequently, the module used is a single-sided module, low-cost, which is customised by conductive ink printing to make it a double-sided module, capable of electrically connecting its semiconductor component to an electric circuit arranged outside the module or on a free surface of the dielectric film of the module.

According to another aspect or embodiment of the invention, particularly within the context of a module in form of printed electronic circuits (produced by conductive ink or material printing), the electric circuit (antenna, paths, electrically conductive surfaces) to which the component of the module is connected (particularly an electronic chip of a semiconductor), may comprise a path 20 and/or conductive path 20 and/or conductive area 22 (the latter may be borne by the support film and produced by conductive ink (or material) printing.

If necessary, in case of difficulty in soldering the connection wire between a chip stud and a path and/or surface created by printing. One end of the wire may be connected in particular by soldering to a portion of surface or metallic pad particularly etched appearing preferably (but not necessarily) on a side of the support film already receiving metallisations. This portion of surface of interconnection pad serves to interconnect an end of the lead wire and a path which has been printed by a printing process. This printed path extends in this case over the support film and over at least a part of this interconnection pad. The opposite end of the lead wire is soldered to a stud of a semiconductor chip.

Figure 3:
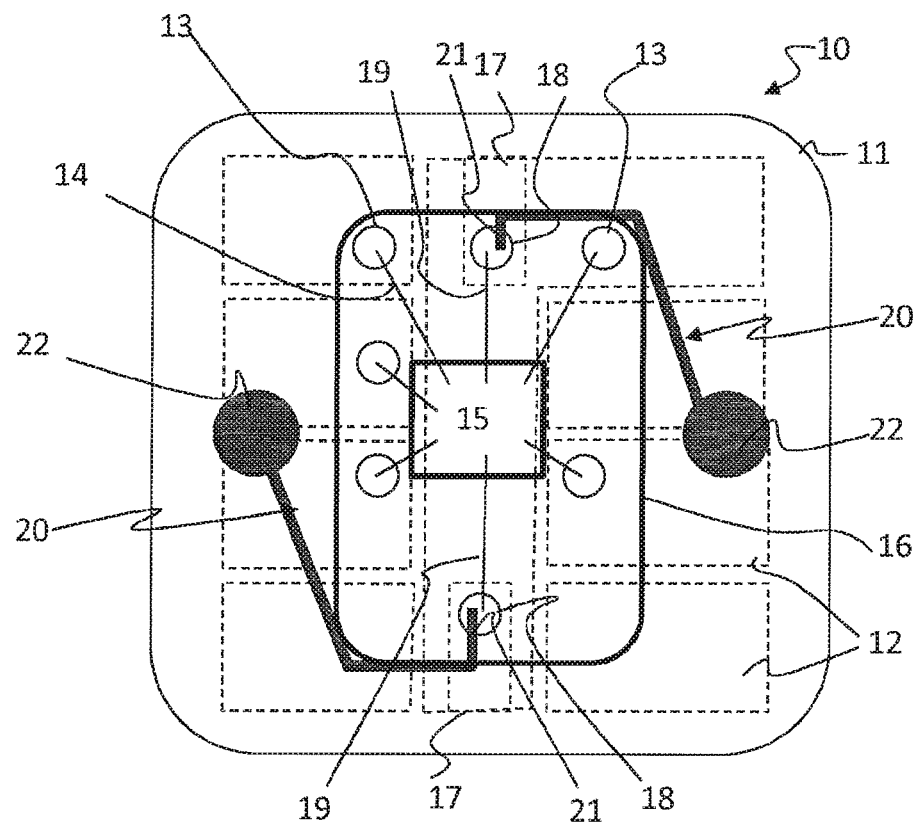
FIG. 3 is a diagram of an electronic module seen from its side bearing a semiconductor component, realised according to another embodiment.

In the event that each portion of interconnection surface is arranged on the side bearing the ohmic contact pads, the process provides for electrical insulation of the portion of interconnection surface against the other contact pads, particularly by means of a peripheral groove such as the island 17 (FIG. 3).

The invention claimed is:

1. A method of manufacturing an electronic module comprising a dielectric support film bearing conductor paths and a semiconductor component connected to the conductor paths, wherein said method comprises:
   a stage of printing conductive material to form conductor paths on a first side of the dielectric support film by means of a process involving printing said conductor paths directly on the dielectric support film using a conductive ink or conductive material; and
   transfer and connection of a contact of a semiconductor component, which is provided on the first side of the dielectric support film, to the conductor paths by means of lead wires, wherein one or more of said lead wires directly connects one or more contacts of the semiconductor component to the conductive ink or conductive material printed to form one or more of said conductor paths.

2. The method according to claim 1, further comprising a prior stage involving assembling a metallised layer on a second side of the dielectric support film, creating several electrical contact pads in said metallised layer and electrically connecting said semiconductor component to said electrical contact pads.

3. The method according to claim 1, wherein a second end of each conductor path is created on a surface so as to form an interconnection pad designed to be electrically connected to an interconnection terminal of an electric circuit.

4. The method according to claim 1, wherein each end of each lead wire is fixed on the one hand to a contact stud of the semiconductor component and on the other hand to an electrical contact island, a contour of which is previously marked out in a contact pad, passing through a reservation formed in a thickness of the dielectric support film with respect to said electrical contact island, so that it electrically connects said contact stud of the semiconductor component to said electrical contact island and wherein a first end of each conductor path to be connected is printed on a surface of said electrical contact island in said reservation and emerges on a side of the dielectric support film bearing said semiconductor component.

5. The method according to claim 1, wherein the conductor paths are printed using one of the following methods: inkjet, spray, LIFT, silkscreen printing, flexography or photoengraving.

\* \* \* \* \*